United States Patent
Anthon et al.

(10) Patent No.: US 6,912,235 B2
(45) Date of Patent: Jun. 28, 2005

(54) APPARATUS AND METHOD FOR PHASE CONTROL OF TUNABLE EXTERNAL CAVITY LASERS

(75) Inventors: Douglas W. Anthon, El Cerrito, CA (US); Jill D. Berger, Los Gatos, CA (US); Alexander A. Tselikov, Fremont, CA (US); Stephen J. Hrinya, San Jose, CA (US); Howard S. Lee, San Jose, CA (US); Alan A. Fennema, San Jose, CA (US); Man F. Cheung, Campbell, CA (US)

(73) Assignee: Iolon, Inc., San Jose, CA (US)

( * ) Notice: Subject to any disclaimer, the term of this patent is extended or adjusted under 35 U.S.C. 154(b) by 52 days.

(21) Appl. No.: 10/210,039

(22) Filed: Jul. 31, 2002

(65) Prior Publication Data

US 2003/0026302 A1 Feb. 6, 2003

Related U.S. Application Data

(60) Provisional application No. 60/364,820, filed on Mar. 15, 2002, provisional application No. 60/350,408, filed on Jan. 18, 2002, and provisional application No. 60/309,547, filed on Aug. 1, 2001.

(51) Int. Cl.[7] .............................. H01S 3/098; H01S 3/13
(52) U.S. Cl. ........................ 372/29.02; 372/18; 372/19; 372/32
(58) Field of Search ................................ 372/20, 29.02, 372/18, 19, 29.021, 29.014, 32, 29.01, 29.22

(56) References Cited

U.S. PATENT DOCUMENTS

| | | | |
|---|---|---|---|
| 4,896,325 A | | 1/1990 | Coldren |
| 5,450,428 A | * | 9/1995 | Maeda ......................... 372/20 |
| 5,771,252 A | | 6/1998 | Lang et al. |
| 5,867,512 A | * | 2/1999 | Sacher ......................... 372/20 |
| 2001/0036206 A1 | * | 11/2001 | Jerman et al. ................. 372/20 |

OTHER PUBLICATIONS

L.A. Coldren et al., "Diode Lasers and Photonic Integrated Circuits", A Wiley–Interscience Publication, New York, 1995, ISBN 0–471–11875–3, Publication No. 94–39383, pp. 350–353.

Antoine Godard et al., "Side–Mode Gain in Grating–Tuned Extended–Cavity Semiconductor Lasers: Investigation of Stable Single–Mode Operation Conditions", IEEE Journal of Quantum Electronics, vol. 38, No. 4, Apr. 2002, pp. 390–401.

Michael G. Littman et al., "Spectrally Narrow Pulsed Dye Laser Without Beam Expander" Applied Optics, vol. 17, No. 14, Jul. 15, 1978, pp. 2224–2227.

Karen Liu et al., "Novel Geometry for single–Mode Scanning of Tunable Lasers", Optical Society of America, vol. 6, No. 3, Mar. 1981, pp. 117–118.

(Continued)

*Primary Examiner*—Minsun Oh Harvey
*Assistant Examiner*—Armando Rodriguez
(74) *Attorney, Agent, or Firm*—Dorsey & Whitney LLP

(57) ABSTRACT

An apparatus and method for controlling the phase of a tunable laser is provided. Stabilization of the mode of a laser beam is provided as the laser is tuned to a target frequency. For one embodiment, a laser generates a reference beam and an output beam. The power of each of beam is measured by optical detectors, and a ratio thereof is utilized to detect when a mode hop occurs as the laser is coarsely tuned. The average of the pre and post mode hop ratios is utilized as a control setpoint while finely tuning the laser to the target frequency. Wavelength lockers, optical power dividers and optical detectors are utilized to determine power levels of the reference and output beams while also monitoring frequency characteristics thereof. A control unit utilizes the outputs from the wavelength locker to control the operation of the extended cavity laser during and after tuning.

37 Claims, 9 Drawing Sheets

OTHER PUBLICATIONS

Shigenori Mattorni et al., "A Mode Hopping Suppressed External–Cavity Semiconductor Laser Using Feedback Control", IEICE Trans. Electron., vol. E85–C, No. 1, Jan. 2002, pp. 98–103.

V.L. Velichanskil et al., "Asymmetry of Some Characteristics of Tunable Injection Lasers With An External Resonator", Sov. J. Quantum Electron, vol. 11, No. 9, Sep. 1981, pp. 1165–1171.

Paul Zorabedian, "Tunable Lasers Handbook: Chapter 8: Survey of External–Cavity Laser Design", F.J. Duarte, Academic Press, San Diego, 1995, pp. 398–407

* cited by examiner

APPARATUS AND METHOD FOR PHASE CONTROL OF TUNABLE EXTERNAL CAVITY LASERS

CROSS-REFERENCE TO RELATED APPLICATIONS

The present application claims priority to U.S. provisional patent application Ser. No. 60/309,547, filed Aug. 1, 2001, in the name of inventor Alexander A. Tselikov and entitled "Method and Apparatus for Longitudinal Mode Stabilization," U.S. provisional patent application Ser. No. 60/350,408, filed Jan. 18, 2002, in the name of inventors Douglas W. Anthon, et al. and entitled "Apparatus and Method for Phase Control of an External Cavity Semiconductor Laser," (hereinafter, the "'408 application") and U.S. provisional patent application Ser. No. 60/364,820, filed Mar. 15, 2002, in the name of inventors Alan A. Fennema, et al. and entitled "Power Control with Phase Compensation for Tunable Lasers," the entire contents of each of which are incorporated herein by this reference.

INVENTIVE FIELD

The various embodiments of present invention generally relate to the field of widely tunable semiconductor lasers and particularly to the control and stabilization of the mode of an external cavity semiconductor laser.

BACKGROUND

Lasers and other optical signal sources are well established as the preferred transmission source for many communication and optical sensing applications. To facilitate uniformity in the transmission of information signals via optical mediums, the International Telecommunications Union (ITU) has specified a standard grid of frequency channels which are separated by multiples of 50 or 100 GHz, or 400 to 800 pm in wavelength. These standards have since been used to develop systems which utilize dense wavelength division multiplexing (DWDM) to transmit multiple channels, often with significantly less than 100 GHz of channel separation, over a single fiber optic medium. Due to these narrow channel separations, an optical source, such as a laser, must operate reliably on a single longitudinal mode and be controlled in frequency to within a few GHz of a given channel's center frequency. As the demand for bandwidth increases, it is anticipated that channel spacing of 50 GHz or even 25 GHz will become desirable by owners and operators of fiber optic communication systems. Such ever narrower channel spacing will further accentuate the need for lasers to tightly control the mode and frequency of an output laser beam.

Commonly, distributed feedback lasers (DFBs) are used to generate the laser beam (or light) used for each communications channel supported by a given communications system. DFBs consist of a monolithic resonator structure with a distributed Bragg reflector integrated into the semiconductor laser waveguide structure. However, DFBs only operate on a single frequency and are not tunable. For example, if 80 channels are utilized in a given communications system, then 80 DFBs are generally needed (i.e., one for each channel). As is readily apparent, supporting and providing 80 lasers (often on each of a multitude of nodes in a communications system) is cumbersome, expensive and presents numerous supply and logistical issues. Further, as the channel spacing continues to decrease, the number of lasers desired for a given transmission medium, using DFBs, could become quite large. Thus, there is a need for tunable lasers that can be reliably tuned, locked and stabilized at a given frequency, without requiring extensive delay or the need to utilize additional calibration equipment, such as spectrometers.

Various types of tunable lasers are currently available. These include vertical cavity semiconductor lasers (VCSEL), segmented-grating distributed Bragg reflector lasers (SGDBR) and external cavity semiconductor lasers (ECLs). As is discussed in greater detail in the '408 application, each of these types of tunable lasers have advantages and disadvantages. The advantages and disadvantages of VCSELs and SDCBRs, when compared with ECLs, have led many developers of tunable lasers to direct their attention to ECLs.

Various implementations of ECLs currently exist. Some of these implementations are described in P. Zorabedian, "Tunable External Cavity Semiconductor Lasers," in *Tunable Laser Handbook* (F. J. Duarte Ed.), Academic Press, San Diego, 1995. Additional ECL designs can also be found, for example, in U.S. Pat. No. 5,771,252, entitled "External Cavity, Continuously Tunable Wavelength Source," and in co-pending U.S. patent application Ser. No. 09/728,212, filed Nov. 29, 2000, in the name of John H. Jerman, et al. and entitled "Tunable Laser with Microactuator," (hereinafter, the "'212 application") the entire contents of each of which are incorporated herein by reference.

In general, ECLs, like most tunable lasers, utilize an optical filter in a resonator cavity to ensure that losses are large for all but the target frequency and for one of the many modes that overlap the gain curve for such target frequency. As is common to all lasers, and true for ECLs in particular, it is possible to adjust the absolute frequencies of a plurality of modes by changing the length of the resonator cavity. Further, ECLs and other tunable lasers commonly include a mechanism by which the frequency of the optical filter may be changed (within a predefined range). Various approaches for controlling the frequency of ECLs have been proposed. For example, co-pending U.S. patent application Ser. No. 10/099,412, filed Mar. 15, 2002, in the name of inventors Jill D. Berger, et al. and entitled "Apparatus for Frequency Tuning and Locking and Method for Operating Same," (hereinafter, the "Frequency Tuning Application"), the entire contents of which are incorporated herein by reference, describes various embodiments of wavelength lockers (WLL) that may be utilized to tune an ECL to a target frequency.

While WLLs and similar apparatus have shown to be effective in tuning an optical filter to a target frequency, frequency control is merely the first step in tuning a laser. As mentioned previously, the mode at which the laser operates must also be properly tuned whenever the optical filter's frequency is changed. It has been the combination of these two steps, efficiently tuning the frequency while stabilizing the mode, which have presented obstacles to the cost-effective implementation of ECLs and other tunable lasers. More specifically, controlling the mode while changing the frequency, and vice versa, has proven to be extremely problematic because as a given laser is tuned to a target frequency, a mode hop may often undesirably occur. Tuning a laser can be further exacerbated by the fact that many tunable lasers utilize multiple optical filters, each of which must be correctly tuned in order to provide an output laser beam at a target frequency and mode. Multiple filters are commonly used in the before mentioned ECL designs described by Zorabedian and also for many segmented-grating distributed Bragg reflector lasers (SGDBR), such as those described in L. A. Coldren and S. W. Corzine's *Diode*

*Lasers and Photonic Integrated Circuits*, Wiley, N.Y., 1995 and also in U.S. Pat. No. 4,896,325, which is entitled "Multi-Section Tunable Laser with Differing Multi-Element Mirrors," the entire contents of each of which are incorporated herein by reference.

One approach for controlling the mode of a tunable laser utilizes encoders, which measure the precise position of actuators used to control the various elements utilized in a given optical filter. For example, an external cavity filter often utilizes at least one actuator such as a micro-electro-mechanical-system (MEMS) actuator. Since MEMS actuators exhibit hysteresis and resonant behavior, encoders may be utilized to determine the precise relative position of the mirror. However, encoders are undesirable in some tunable laser applications because of the size and the inherent difficulty in precisely calibrating encoders. Therefore, there is a need for a tunable laser for which the mode may be stabilized while the frequency is efficiently and reliably tuned to a desired target frequency.

SUMMARY

A laser apparatus operable at a plurality of modes over an optical frequency range is provided. The laser apparatus includes a laser source for generating a first and second beams of light, a first optical detector for receiving at least a portion of the first beam of light and generating a first signal, a second optical detector for receiving at least a portion of the second beam of light and generating a second signal and a control unit coupled to the first and second optical detectors for generating at least one control signal to stabilize the apparatus on a mode.

Further, an apparatus and method for tuning a laser to a desired target frequency while stabilizing a mode of an output beam from the laser is provided. More specifically, the present invention, for one embodiment utilizes a waveguide gain medium or optical gain source (which is hereinafter referred to as a "laser source") incorporated into a frequency-selective external resonator which includes a filter to generate a reference beam and an output laser beam. By determining a ratio of the power of the output beam to the power of the reference beam, the apparatus of the present invention may utilize such ratio information to determine when a mode hop will occur as the laser is tuned to a desired target frequency and also to prevent mode hops from subsequently happening as the laser is finely tuned to the desired target frequency.

In another embodiment, an external cavity semiconductor laser is utilized in combination with two optical detectors. A first optical decoder is positioned and configured to receive a reference beam generated by a laser source, such as a laser diode. In one embodiment, the first optical detector receives the reference beam prior to the beam being incident upon an external cavity filter. In other and more preferred embodiments, the first optical detector receives the reference beam after it has reflected off of a diffraction grating provided in the external cavity filter. In either embodiment, the first optical detector measures the power of the reference beam and provides such information to a control unit, which controls the operation of the laser and/or the filter.

Further, the external cavity filter may utilize a variety of filtering devices and apparatus. In one embodiment, the filter includes a movable diffraction grating and a movable mirror. The diffraction grating is suitably moved by a piezoelectric translator actuator (hereinafter, a "PZT") under the control of the control unit. Similarly, the mirror is suitably rotated and translated related to the diffraction grating by a MEMS or other actuator, under the control of the control unit. Additionally, the PZT actuator may impart some rotation of the diffraction grating, while the MEMS actuator may impart some translation of the mirror. Both of these devices are utilized to control the frequency and mode of an output laser beam, whose tuning, mode and other signal characteristics are suitably detected by the second optical detector. Depending upon the type of signals utilized for a specific embodiment, the second optical detector may include a wavelength locker or similar device which suitably generates a coarse tuning signal (which may be used to coarsely tune the laser to a given target frequency), a fine tuning signal (for finely tuning the laser to the target frequency) a power signal (for controlling the output power of the laser) and the beforementioned power ratio signals for determining when mode hops occur and stabilizing the mode of the output laser beam as the laser is tuned to the target frequency.

In another embodiment, a control unit for use with a tunable laser which may be utilized to inhibit mode hops during tuning is provided. In this embodiment, the control unit includes at least one input port for receiving a reference power signal and an output power signal, at least one output port for providing a laser control signal to the tunable laser, and a digital signal processor connected to the at least one input port and the at least one output port for utilizing a ratio of the reference power signal and the output power signal to determine when a mode hop occurs and hold the ratio at an average of a pre-hop value and a post-hop value when outputting control signals for directing the laser to tune to a target frequency.

A further embodiment includes another tunable laser. For this embodiment, the tunable laser comprises a laser source for providing a light with a wavelength along an optical path, a diffractive element, positioned in the optical path and spaced from the laser source, for redirecting the light received form the laser source, a reflective element positioned in the optical path and spaced from the diffractive element, for receiving the light redirected by the diffracted element and for further redirecting the light along the optical path to the diffractive element; the diffractive element receiving the light further redirected by the reflective element and returning the light along the optical path to the laser source.

In one embodiment, a method for tuning a laser apparatus operable at a plurality of modes over an optical frequency range and having a laser source providing first and second beams of light is provided. For this embodiment, the method includes the steps of monitoring the power of the first and second beams of light and utilizing the monitored power to stabilize the apparatus on a mode. In another embodiment, a method for tuning a laser is also provided. This method basically provides for coarsely tuning the laser to the desired target frequency. Then, the phase of the laser is reset. Next, the ratio of the power of the output beam to the reference beam is monitored as the cavity length is changed. When a sudden change in value is detected, a mode hop has occurred. The average of the power ratio substantially immediately prior to and substantially immediately after the mode hop is then calculated as the optimum power ratio. The power ratio is then held constant at the optimum power ratio as the frequency of the output laser beam is finely tuned to the target frequency and as the power of the output beam is adjusted to the desired output power. In this manner, the various embodiments of the present invention provide for a tunable laser with a stabilized mode during tuning operations.

BRIEF DESCRIPTION OF THE DRAWINGS

The accompanying drawings, which are somewhat schematic and are incorporated in an form a part of this specification, illustrate various embodiments of the present invention and, together with the detailed description, serve to explain the principles of the present invention.

DETAILED DESCRIPTION

Tunable lasers can be utilized in a variety of applications, especially applications where it is desirable to tune a laser to a plurality of selected frequencies. One such application is a light wave communications or telecommunications system, such as the system described in the before mentioned Frequency Tuning Application. The present invention provides various embodiments of tunable lasers, for which both mode and frequency control are provided. It is to be appreciated, that these various embodiments may be utilized in the systems described in the Frequency Tuning Application and/or in other systems, some of which may or may not involve communications. As such, the present invention is herein described in the context of providing a tunable laser providing an output beam whose mode is stabilized while the frequency is tuned to a desired target frequency, without regards as to the specific applications or systems to which any of the various embodiments of the present invention may be utilized.

Figure 1:
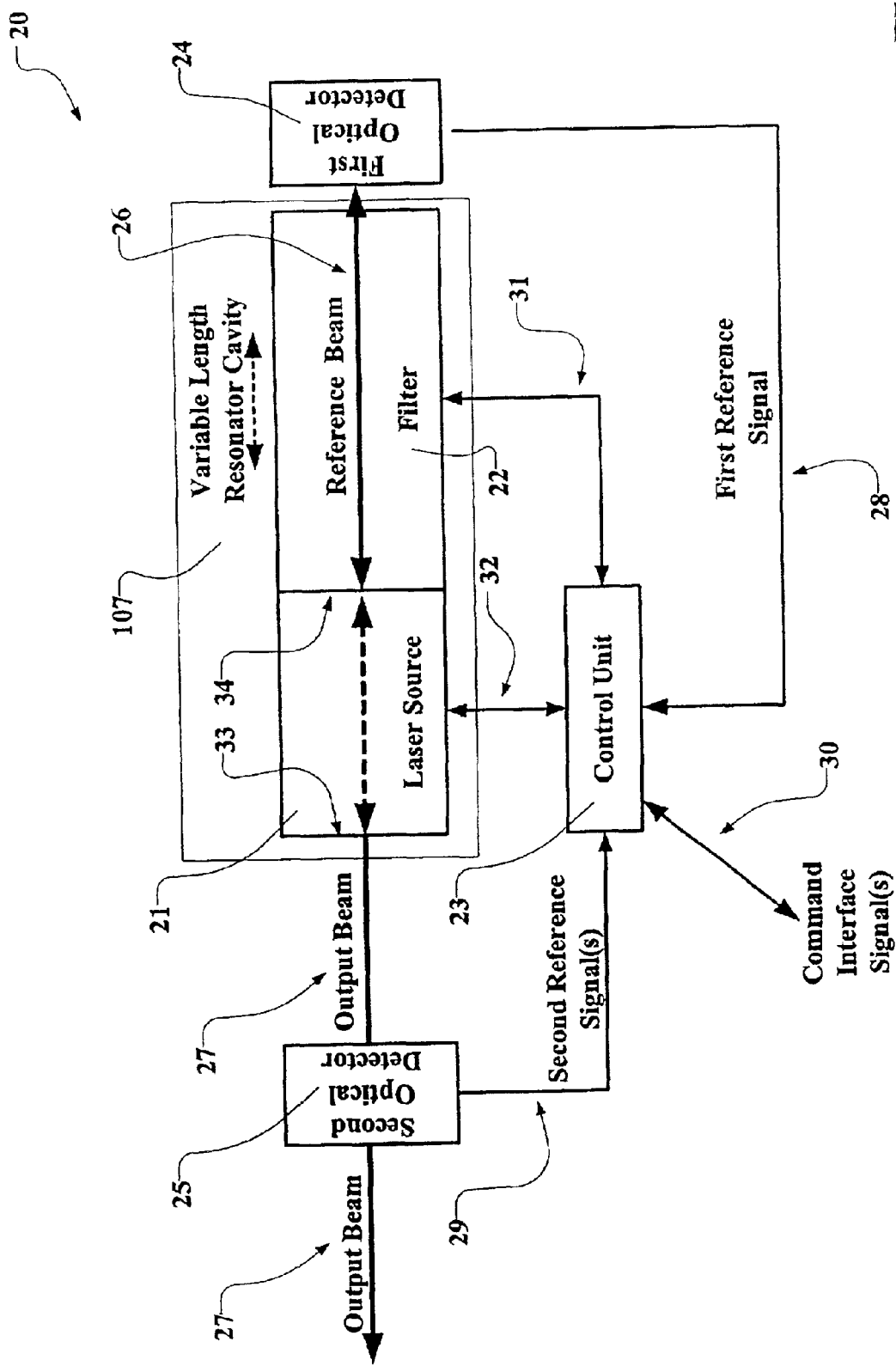
FIG. 1 is a block diagram of a first embodiment of a tunable laser for the present invention in which the mode may be stabilized while the frequency of an output laser beam is being tuned to a desired target frequency.

With reference to FIG. 1, a schematic diagram provides an overview of the various components and/or devices utilized to provide a tunable external cavity semiconductor laser (hereinafter, a "tunable laser") which, consistent with the teachings of the present invention, can be configured to generate a laser output beam that is mode stabilized over a plurality of frequencies. As shown, in general, a tunable laser 20 includes a laser source 21, which is incorporated into an optical resonator 107 containing a filter 22. The tunable laser 20 also generally includes and/or is controlled by a control unit 23, which is in communication with the laser source 21, the filter 22, and a user/system interface (not shown). It is to be appreciated that features and functions of the control unit 23, as further described hereinbelow, may be provided within or separate from the laser source 21 and/or the tunable laser 20. The tunable laser 20, for the various embodiments of the present invention, also includes a first optical detector 24, which is configured and positioned to receive and measure at least one signal characteristic of a first or reference beam 26 generated by the laser source 21, and a second optical detector 25, which is configured and positioned to receive and measure at least one characteristic of a second or output beam 27 generated by the laser source 21. As shown, the first optical detector 24 generates and provides a first signal 28 to the control unit 23. Similarly, the second optical detector generates and provides a second signal 29 to the control unit 23. The control unit 23 utilizes these signals 28 and 29 and, when necessary, command interface signals 30 from the user/system interface to control the operation of the laser source 21 and the filter 22, as is described in greater detail hereinbelow.

More specifically, the various embodiments of the present invention may utilize any suitable laser medium as the laser source 21. The laser source 21 desirably is capable of producing the output beam 27 at a desired target frequency. Laser source 21 generates at least one output beam of light, such as output beam 27 and, in this regard, can have multiple output beams with identical spectral features. When multiple beams are provided, the majority of the output power is carried by the primary output beam, such as beam 27, and significantly less power by the secondary beams. In one embodiment, the laser source 21 is a semiconductor laser source of the type disclosed in the beforementioned '212 application. The laser source 21 may be tunable across a band of wavelengths within the erbium fiber gain bandwidth, for example, the Conventional or C-band covering a range of approximately 35 nanometers from 1530 nanometers to 1565 nanometers. The corresponding frequency span is approximately 4.4 THz with a lower frequency bound of approximately 191 THz. The laser source 21 may, for example, be locked to one of a grid of frequencies with a fixed separation of 50 GHz and a reference frequency of 193.1 THz commonly referred to as the 50 GHz ITU grid. In other embodiments, a fixed separation of 25 GHz, or some other yet to be specified frequency separation, may also be utilized.

Further, the laser source 21 has a first or front facet 33 and a second or rear facet 34 that together define an internal cavity. The laser source 21 is preferably constructed such that the output laser beam 27 is emitted, via the first facet 33, while the output from the second facet 34 is emitted into the resonator cavity 107 and is primarily coupled to the filter 22 to provide frequency selective optical feedback to the laser source 21, with a portion of the output from the facet 34 being directly coupled out as the reference beam 26. The laser source 21, for one embodiment, may be a laser diode, such as a Fabry-Perot laser diode with an anti-reflection coating on facet 34.

Figure 2A:
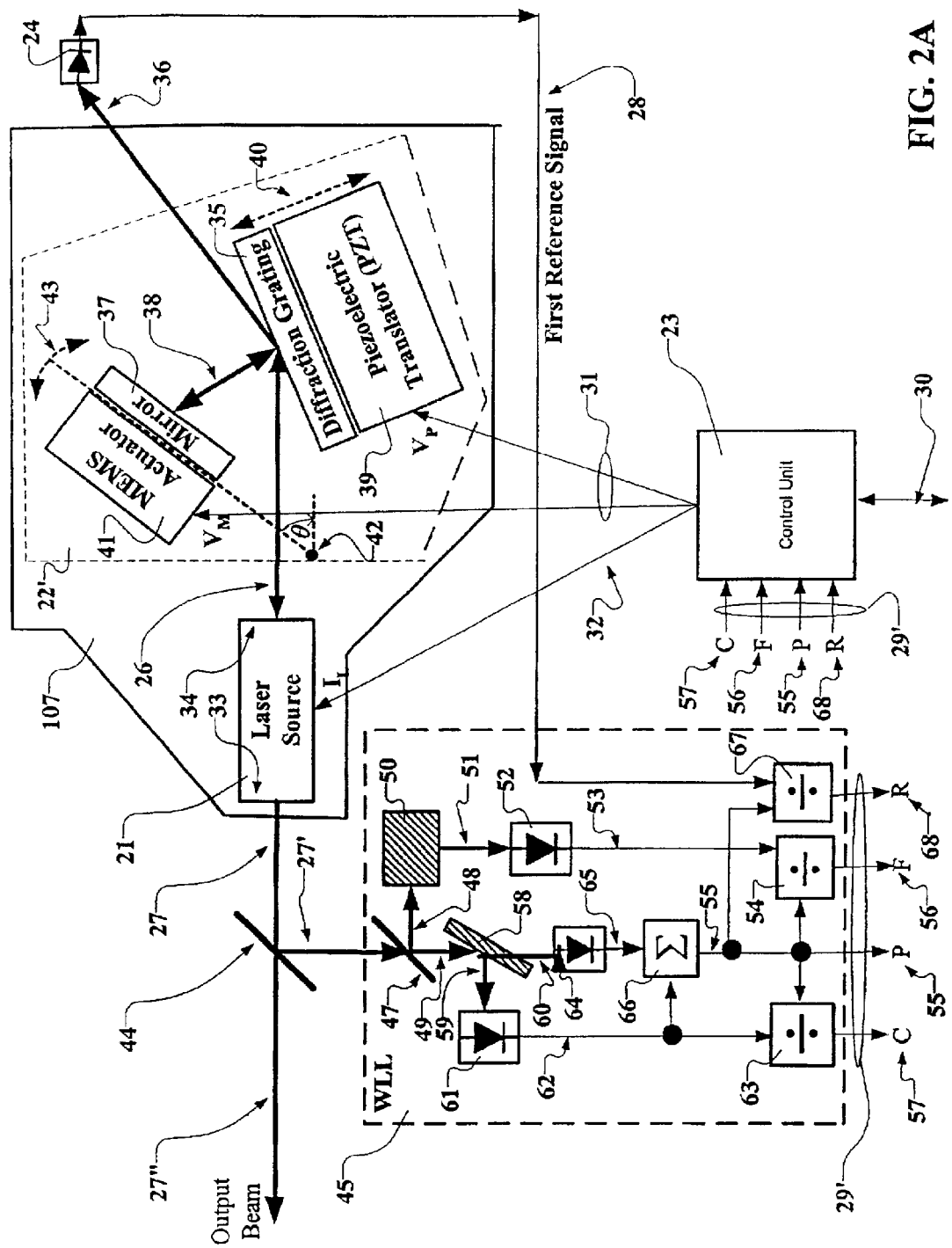
FIG. 2A is a block diagram of second embodiment of a tunable laser for the present invention in which a wavelength locker is utilized as the second optical detector and, in combination with a first optical detector, stabilizes the mode while tuning an output laser beam to a desired target frequency.

As mentioned previously, the laser source 21 is suitably connected to resonator cavity 107 which includes a filter 22. The filter 22 may be of any configuration which enables a reference beam 26 generated by a laser source 21 to be filtered until the laser source 21 emits the output beam 27 at the desired frequency and mode. In one embodiment, the filter 22 is an extended cavity filter (i.e., the filter portion of an ECL). Various embodiments of an external cavity filter are described in the '212 application, various other embodiments of ECLs may also utilized and suitably modified, as specified by the teachings of the present invention. One such embodiment of an external cavity laser, which is consistent with the teachings of the present invention, is shown in FIG. 2A. As shown in FIG. 2A, an external cavity filter 22' generally includes a diffraction grating 35, which receives the reference beam 26 generated by the laser source 21 (e.g., a laser diode) and diffracts a portion of the reference beam 26 towards a mirror 37. Hereinafter, the portion of the reference beam 26 that is diffracted towards the mirror 37 is referred to as the diffracted beam 38. The diffraction grating 35 also reflects the reference beam 26 towards the optical detector 24. The beam reflected by the diffraction grating is hereinafter, also referred to as the first beam of light 36. It is to be appreciated that the first beam of light 36 is a first order reflection of the reference beam 26 and for all practical purposes is the same as the reference beam.

More specifically, the diffraction grating 35 basically serves as a beam splitter, splitting off a small fraction of the reference beam 26 as the first beam of light 36 for purposes of characterization. By comparing the power of the first beam of light 36 to the power of the output beam 27 it is possible to infer the loss of the filter 22 or 22'. More specifically, the ratio of the power of the output beam 27 to the power of the first beam of light 36 is ideally proportional to a single pass gain through the waveguide/laser source, which desirably equals the square root of the round trip gain. Therefore, to maintain a constant output beam 27, the round trip gain desirably equals the filter loss, such that the power ratio is proportional to the square root of the filter loss. Thus, by measuring the power of the first beam of light 36, i.e., the beam which effectively does not go through the filter 22 or 22', it is possible to infer the loss of the filter 22'. This approach of determining power levels is preferably utilized because for an ECL it is often difficult to isolate the filter 22 or 22' and it is often impossible to measure the power transmitted through the filter 22 or 22' because, as the reference beam 26 is spatially dispersed by the diffraction grating 35, no loss is introduced in the diffracted 38 until portions of the diffracted beam 38 fail to couple back to the waveguide of the laser source 21. As such, generally, the two places where the power of the laser source 21 can be accurately measured is at the front and rear facets of the laser source (i.e., the power provided in the reference beam 26 and the output beam 27).

The external cavity filter 22' further includes a PZT actuator 39 or any other suitable microactuator, connected to the diffraction grating 35, by which translation of the diffraction grating 35 in relation to the path of the reference beam 26 may be provided. As mentioned previously, the PZT may also contain a component of rotation. As is discussed in greater detail below, translation of the diffraction grating 35 may be utilized to control the mode of the output beam 27. The approximate direction of translation of the diffraction grating 35 by the PZT 39 is represented by arrow 40. Also, included in the external cavity filter 22', for the embodiment of FIG. 2A, is a MEMS or any other suitable actuator 41 which is connected to the mirror 37. The MEMS actuator 41 facilitates rotation and some translation of the mirror 37 relative to the diffraction grating 35. More specifically, the MEMS actuator 41 primarily rotates the mirror 37 about a pivot point 42 as represented by arrow 43 and in doing so, rotates and translates relative to the diffraction grating 35. As is discussed in greater detail hereinbelow, the combination of the diffraction grating 35 and the mirror 37 are utilized to control the frequency and mode of the output beam 27, for at least one embodiment of the present invention.

Referring again to the schematic representation of FIG. 1, the tunable laser 20 also includes a first optical detector 24 which is positioned relative to the resonant cavity 107 and the filter 22 so as to receive the reference beam 26. For the embodiment shown in FIG. 2A, the first optical detector 24 is positioned relative to the diffraction grating 35, as discussed hereinabove, and receives the first beam 36, that is, the true reflection of the reference beam 26 by the diffraction grating 35. The first optical detector 24 is configured to receive the first beam 36 and generate the first reference signal 28. The first optical detector 24, upon receiving the first beam 36, measures the power in such beam 36 and provides an indication of the measured power in the first reference signal 28. It is to be appreciated, however, that the first optical detector may also be configured to measure additional characteristics of the first beam 36, as particular applications require, without departing from the spirit or scope of the present invention. However, for purposes of this discussion, the first optical detector 24 is configured to communicate directly or indirectly with the control unit 23, via the first reference signal 28, an indication of the power received from the laser source 21 in the first beam 36.

Referring again to FIG. 1, the tunable laser 20 also includes the second optical detector 25. This detector 25 is suitably positioned to receive the output beam 27 from the laser source 21 and communicate characteristics of such output beam 27 to the control unit 23. In one embodiment, the second optical detector 25 is configured to measure the power of the output beam 27. However, in other embodiments, the second optical detector 25 may be configured to measure the frequency and/or other characteristics of the output beam 27. As is discussed in greater detail hereinbelow, such measured characteristics may be utilized by the control unit 23, for various embodiments of the present invention, to control the frequency and mode of the output beam 27 without requiring the use of any encoders or similar devices.

In the embodiment shown in FIG. 2A, the functions of the optical detector 25 (FIG. 1) are facilitated by a beam splitter or other optical power divider 44. The optical power divider 44 splits the received output beam 27 into two portions: a second reference beam 27' and a transmission beam 27", wherein the second reference beam 27' provides a representation of the power and signal characteristics of the output beam 27 while utilizing a mere fraction of the total power provided in the output beam 27 and/or in the transmission beam 27". However, the frequency and mode characteristics of 27, 27' and 27" are desirably identical. Further, the embodiment of FIG. 2A generates the second reference signal 29' by utilizing a wavelength locker or WLL 45. The WLL 45 outputs the second reference signal 29' to the control unit 23. In the embodiment of FIG. 2A, the second reference signal 29' has four components. These four components are: a coarse tuning signal (as represented by the letter "C"), a measurement of the power of the output beam ("P"), a fine tuning signal ("F"), and a ratio "R", wherein the ratio is determined by dividing the measured power of the second reference beam 27' by the power of the reference beam 26. The utilization of these four components by the control unit 23 is discussed in greater detail hereinbelow.

One embodiment of a WLL is shown in FIG. 2A and is similar to the wavelength lockers disclosed in the Frequency Tuning Application. A second optical power divider 47 is provided in WLL 45 and is configured to receive the second reference beam 27' and split the beam 27' into two further sub-components: a fine tuning beam 48 and a coarse tuning beam 49. In one embodiment, the fine tuning beam 48 is optically communicated to a fine tuning element 50. The fine tuning element 50 filters the fine tuning beam 48 and preferably has an output power that is frequency dependent. The fine tuning element 50 might be any of a variety of filters such as those described in greater detail (with reference to the locking element identified as item number 72) in the Frequency Tuning Application. The fine tuning element 50 produces a fine tuning reference beam 51. This beam 51 is communicated to a fine tuning optical detector 52. The fine tuning optical detector 52 measures the power of the fine tuning reference beam 51 and produces a fine tuning reference signal 53, which is electrically communicated to a fine divisor circuit 54. The fine divisor circuit 54 utilizes the fine tuning reference signal 53 and a power output signal 55 to generate a fine tuning signal "F" 56. The fine tuning signal 56 is electrically or otherwise communicated to the control unit 23.

Similarly, the WLL 45 utilizes the coarse tuning beam 49 to generate a coarse tuning signal 57. With regards to the processing of the coarse tuning beam 49 by the WLL 45, in one embodiment, the beam 49 is first filtered and split by beam splitter or any other suitable optical power divider 58. Beam splitter 58 suitably splits the coarse tuning beam into a filtered coarse beam 59, which is suitable for coarsely tuning the laser 20 and a secondary beam 60. The beam splitter 58 preferably outputs the filtered coarse beam 59 with an output power that varies monotonically with the input frequency over the operating frequency range of the WLL 45. A coarse optical detector 61 receives the filtered coarse beam 59 and generates a coarse tuning detector signal 62, which is suitably provided to a coarse divisor circuit 63. The coarse divisor circuit 54 utilizes the coarse tuning detector signal 62 and the power output signal 55 to generate the coarse tuning signal 57. The coarse tuning signal 57 is electrically or otherwise communicated to the control unit 23.

The coarse tuning detector signal 62 is also provided to a power summing circuit 66. The power summing circuit 66 receives a power reference signal 65 which is generated by a power signal optical detector 64 and is a measurement of the power of the secondary beam 60. The power summing circuit 66 combines the power reference signal 65 and the coarse tuning detector signal 62 to arrive at the power output signal 55, which provides a measure of the total output power of the laser beam 27. Further, the power output signal 55 is also provided to a ratio divisor circuit 67 which utilizes the power output signal 55 and the first reference signal 28 to generate the ratio signal 68, wherein the ratio signal indicates the ratio of the power of the output beam 27 to the power of the reference beam 26.

Figure 2B:
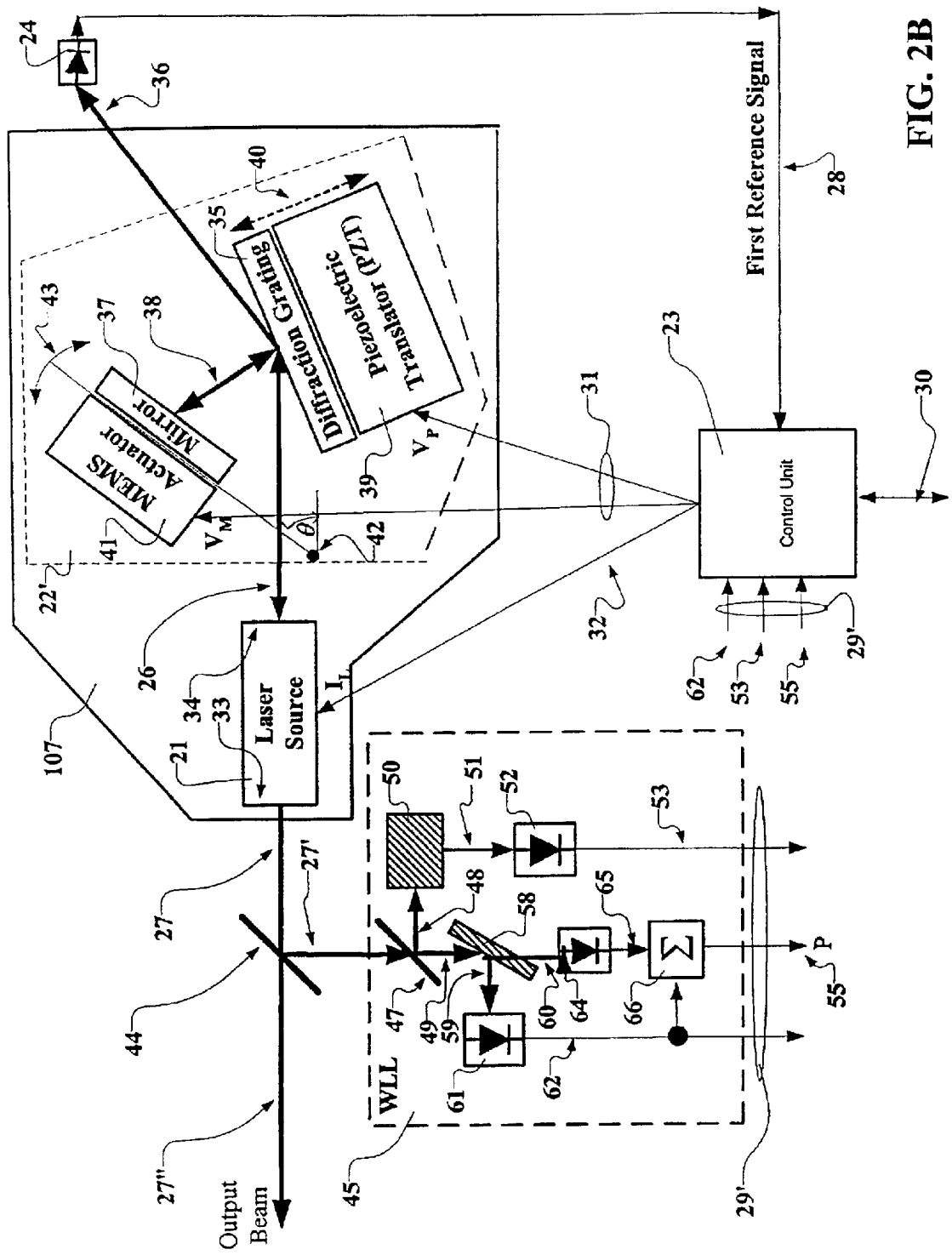
FIG. 2B is a block diagram of a modification of the second embodiment shown in FIG. 2A, wherein the various divisor circuits utilized to generate and provide coarse, fine, power and ratio signals to the control unit are instead provided by a digital signal processor provided with the control unit.

It is to be appreciated, that the embodiment shown in FIG. 2A is primarily illustrative purposes and should not be construed as requiring the utilization of specific components or devices. For example, as shown in FIG. 2B, the various divisor circuits 54, 63, and 67, provided in the WLL 45 embodiment shown in FIG. 2A, may be eliminated. The functions provide by these divisor circuits may instead be performed by a calculation unit, for example, one similar to that described in the Frequency Tuning Application. Similarly, these functions may be performed by a digital signal processor provided for in the control unit 23. As such, it is to be appreciated that other embodiments of the present invention may provide for communicating the first reference signal 28, the power output signal 55, the fine tuning reference signal 53, the coarse tuning reference signal 62, a ratio signal 68 (FIG. 2A) and/or other signals directly or indirectly to the control unit 23 or a similar device configured to perform those calculations and functions necessary to control the operation of the laser 20 as provided for by the present invention.

Referring again to the embodiment shown in FIG. 2A, the tunable laser 20 may include or be in communication with a control unit 23. The control unit 23 may be any device or processor which can receive inputs, for example, from the first optical detector 24 and/or the second optical detector 25, and generate output signals 31 and 32 which control the operation of the laser source 21 and the filter 22 and, thereby, the output beam 27 to a desired target frequency with a stabilized mode. More specifically, in the embodiment of FIG. 2A, the control unit 23 is configured to receive the coarse signal 57, fine signal 56, power signal 55 and ratio signal 68 from the WLL 45. Based upon these inputs and command interface signals 30 which may specify a desired target frequency, the control unit 23 suitably controls the frequency and mode of the output beam 27. More specifically, the control unit 23 controls the frequency and mode of the output beam by controlling the translation of the diffraction grating 35, via adjustments to the voltage provided to the PZT 39, and the rotation of the mirror 37, via adjustments to the voltage provided to the MEMS actuator 41. Further, the control unit 23 controls the output power of the laser source 21 by controlling the input current control signal 32.

Figure 3:
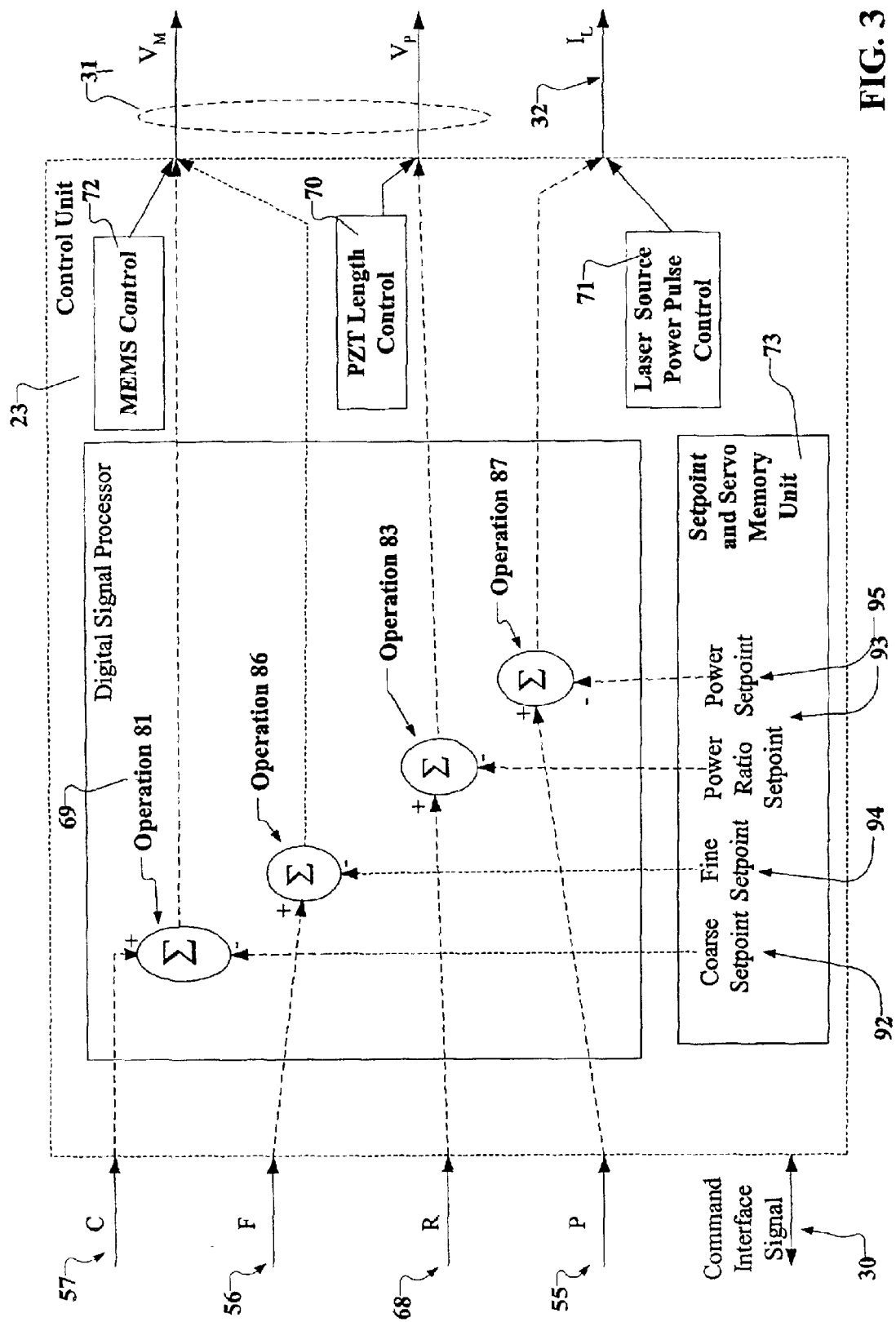
FIG. 3 is a schematic diagram of a control unit which may be utilized in any of the disclosed or other embodiments of the present invention in order to stabilize the mode while tuning the frequency of an output laser beam to a desired target frequency.

One embodiment of a control unit 23 for the present invention is shown in FIG. 3. As discussed above, the control unit may be configured to receive the coarse 57, fine 56, power 55 and ratio 68 signals from the WLL 45, manipulate these signals according to predetermined algorithms and output control signals 31 and 32 to the laser source 21 and the filter 22. More specifically, the control unit 23 includes a digital signal processor 69 which executes algorithms that manipulate the C, F, P, and R signals to control the laser source 21 and the filter 22. These algorithms are schematically illustrated in FIG. 3 and are described in greater detail with reference to FIGS. 4A and 4B.

Additionally, the control unit 23 may include algorithms or additional PZT length control circuitry 70 which controls the length of PZT 39. Also, MEMS control algorithms or circuitry 73 may be utilized to control the MEMS actuator 72. Further, laser source power pulse control algorithms or circuitry 71 may be utilized to pulse off the laser source 21. The control unit 23 also suitably includes or has ready access to a setpoint and servo memory unit 73. The setpoint and servo memory unit 73 may be provided in RAM, ROM or other memory or data storage devices. Such memory or data storage devices may be provided local or remote to the control unit 23. The memory unit 73 should contain sufficient capacity to retain calibrated settings for a power ratio setpoint, coarse setpoint, fine setpoint and a power setpoint. The utilization of these setpoints is further described hereinbelow with reference to FIGS. 4A and 4B. The memory unit 73 may also contain those settings, instructions, algorithms, program routines and other data, information or instructions which may be utilized by the control unit 23 to control the operation of the laser source 21 and/or the filter 22. It is to be appreciated that various instructions and settings, including the beforementioned setpoint settings may be added, modified and/or deleted via command interface signals 30 sent to the control unit 23.

Figure 5:
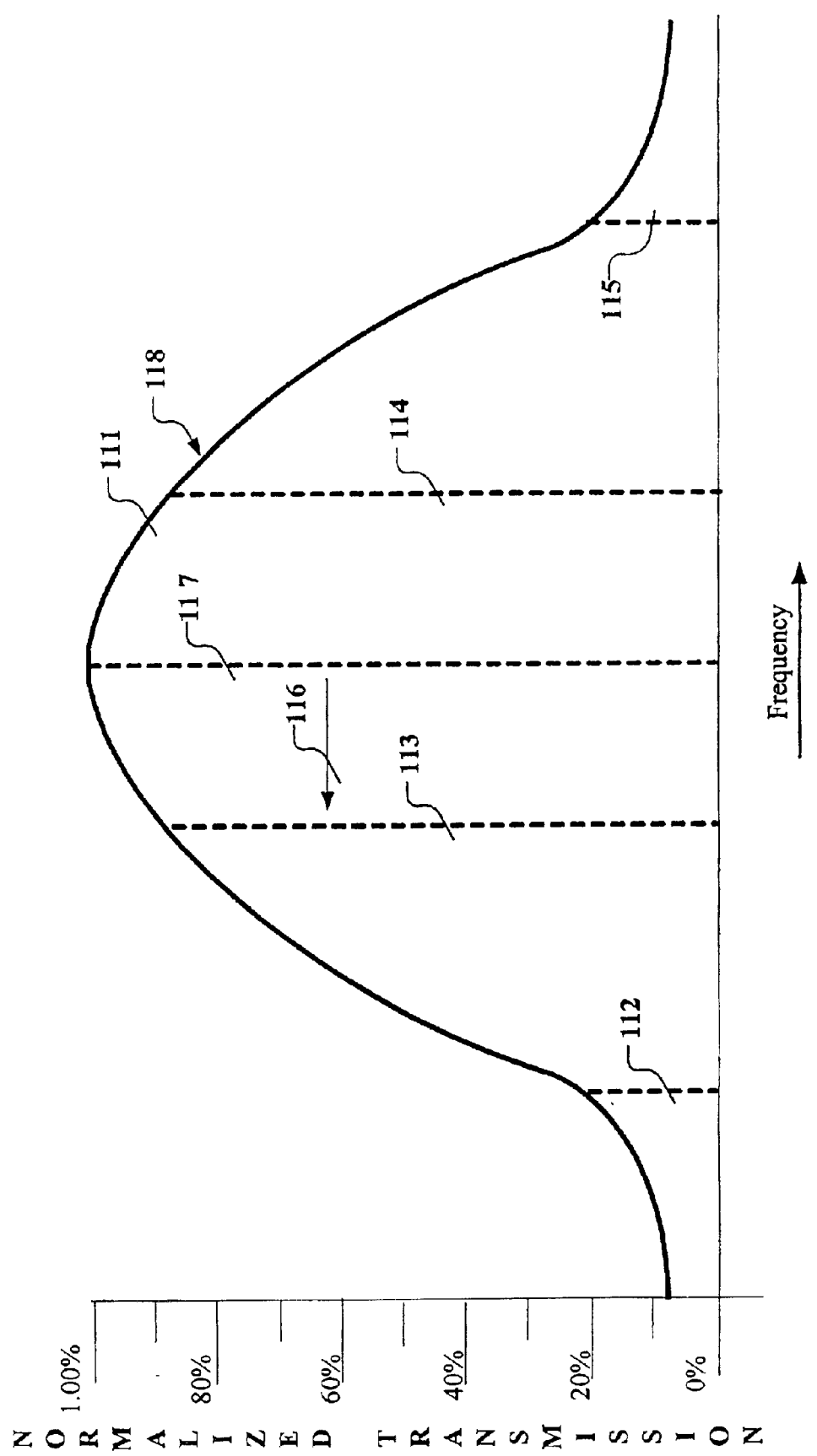
FIG. 5 is a graph depicting the relationship between filter frequency, laser frequency, phase and mode hops for a tunable laser.

Referring to FIG. 1 in conjunction with FIG. 5, the filter 22 is preferably configured to generate a transmission spectrum 111 which is comparable to a normalized Gaussian filter. This Gaussian transmission spectrum 111 is preferably superimposed on a plurality of resonator modes 112–115 which are defined by the condition that the round trip length of the optical resonator be an integral multiple of the laser wavelength, with adjacent modes corresponding to successive integers. The integer corresponding to a particular mode is called mode number. The length of the optical resonator is generally determined by the combination of the length of the laser source 21 and the filter 22. For the embodiment show in FIG. 2A, the length of the optical resonator may vary as the diffraction grating 35 is translated and/or as the mirror 37 is rotated. In the example shown in FIG. 5, mode 113 is assumed to be the oscillating mode, which is offset a distance 116, i.e., a given number of THz, from the center frequency 117 of the filter 22. The difference 116 between the oscillating mode 113 and the center frequency 117 is commonly referred to as the detuning, phase error or phase of the laser 20. Often the frequency and phase of the laser 20 will drift with time.

More specifically, when the phase of a tunable laser is increased (or decreased) past a critical value, the frequency will "hop" to a mode with a different mode number that allows a more optimum phase value to be achieved. For example, as the operating frequency (as designated at 113) is scanned along the frequency "bell" 111 to a new operating frequency at 118, a mode hop may occur from mode 113 to mode 114, wherein "scanning" is accomplished by slightly rotating the mirror 37 relative to the diffraction grating 35 such that the tuning angle θ is slightly changed. In other words, as the frequency is finely tuned, the mode may undesirably hop from a first mode to a second mode. Mode hops commonly result in a momentary and abrupt frequency shift which can be extremely disruptive to communication systems. Further, as the frequency at which a mode hop will occur is approached, degraded laser performance commonly occurs. Side mode suppression ratio (SMSR) data suggests that optimal performance for a tunable laser will commonly occur when the mode is centered over the middle portion of any tuning range. As such, it is highly desirable to minimize mode hops in output signals generated by tunable lasers. The various embodiments of the tunable laser 20 provide a system and method for detecting mode hops and inhibiting their occurrence as a laser is finely tuned.

Figure 6:
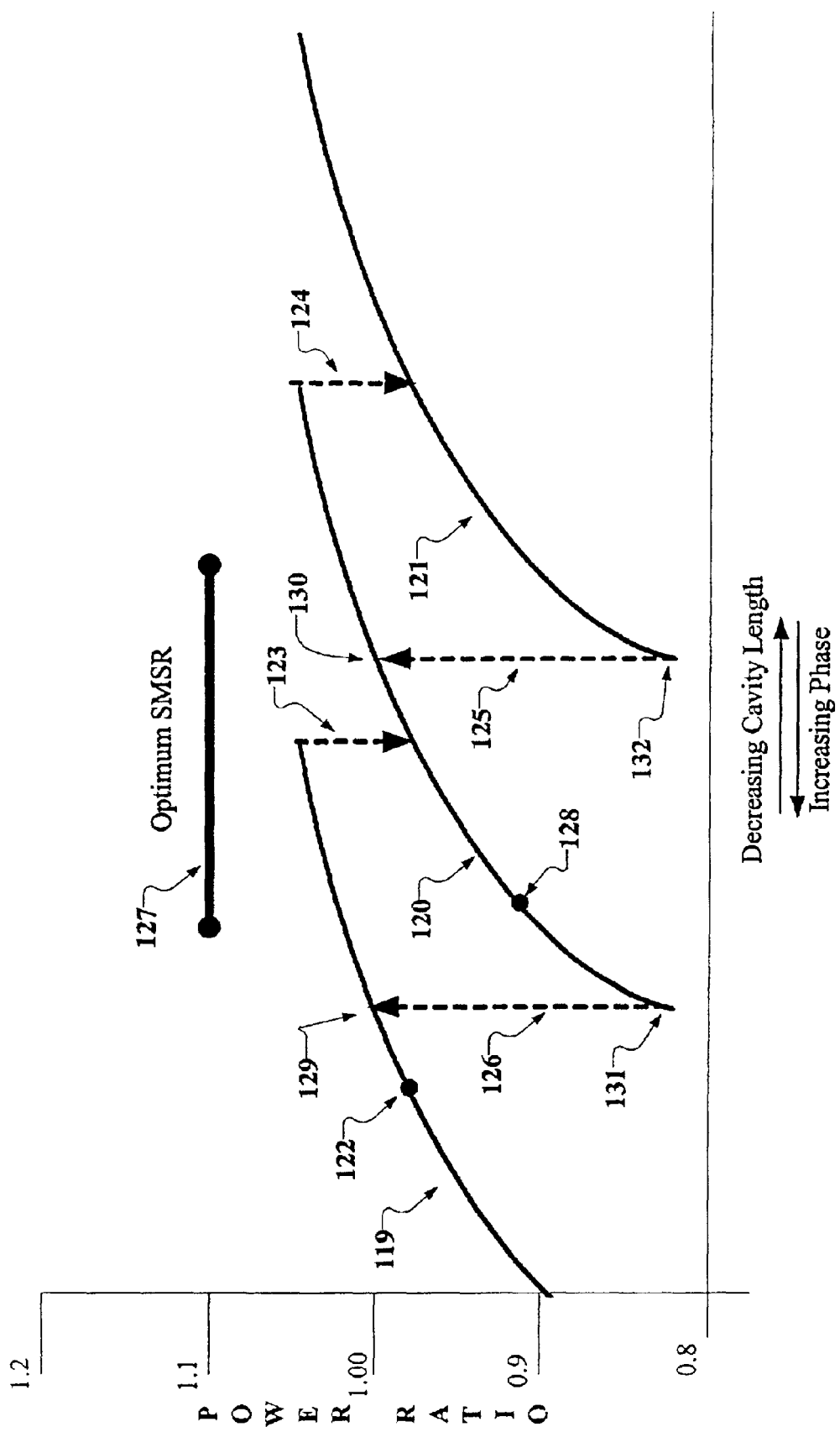
FIG. 6 is a graph depicting the ratio of laser output beam as a function of cavity length for a fixed filter frequency.

In FIG. 6, numerous propagations of the desired transmission spectrum 119 are shown as 119, 120 and 121. At typical laser operating currents, the tuning curves 119, 120, and 121 are not only asymmetric, but the mode hops found with an increasing phase scan differ from those found with a decreasing phase scan. More specifically, FIG. 6 is a typical plot of the power ratio "R" as a function of cavity length for a fixed filter frequency. Scans in the leftward direction correspond to increasing phase, while rightward scans correspond to a decrease in the cavity length and a decreasing phase. Starting a scan from the left on spectrum 119, for example, at curve location 122, the power ratio increases until the mode hop 123 is reached, and then repeats the same pattern through mode hop 124 on spectrum 120. Reversing the scan direction, the power ratio scans downward on spectrum 120 and 121 through mode hops 125 and 126. At the upper part of the increasing scan phase, near mode hops 123 and 124, the phase is approaching zero, and the power ratio of the filter transmission is approaching its maximum. As such, in this segment, the power ratio is relatively insensitive to the phase. In contrast, on the decreasing phase scan, i.e., between mode hops 125 and 126, the power ratio is nearly a linear function of the phase. The present invention utilizes these characteristics to determine a center frequency, e.g., one between mode hops 124 and 126. As shown by inspection of FIGS. 5 and 6, and based upon spectral measurements, the SMSR is close to its optimum value over the central two thirds of this region, as shown by bar 127. More specifically, a phase can be chosen in the more negative portion of the SMSR bar 127 region and the power ratio can be used for phase control because the slope of 120 is larger in this region. Phases in this region are also advantageous for long term stability because, in addition to cavity length changes, the most likely effect of component degradation or mechanical displacement is a small increase in the non-filter losses in the resonator (i.e., losses occurring in the laser source 21). Therefore, when the corresponding increase in gain shifts the power ratio to lower values, the MEMS actuator 41 controlling the mirror 37 will shift the phase to a less negative value and towards the center phase. The present invention utilizes these concepts by specifying that the phase 128 where the power ratio "R" equals the average of the power ratios at the high power end of the decreasing-phase scan (i.e., points 129 or 130) and the power ratios "R" at the low power end of the decreasing-phase scan (i.e., points 131 or 132) is an acceptable, easily defined point in this region.

Figure 4A:
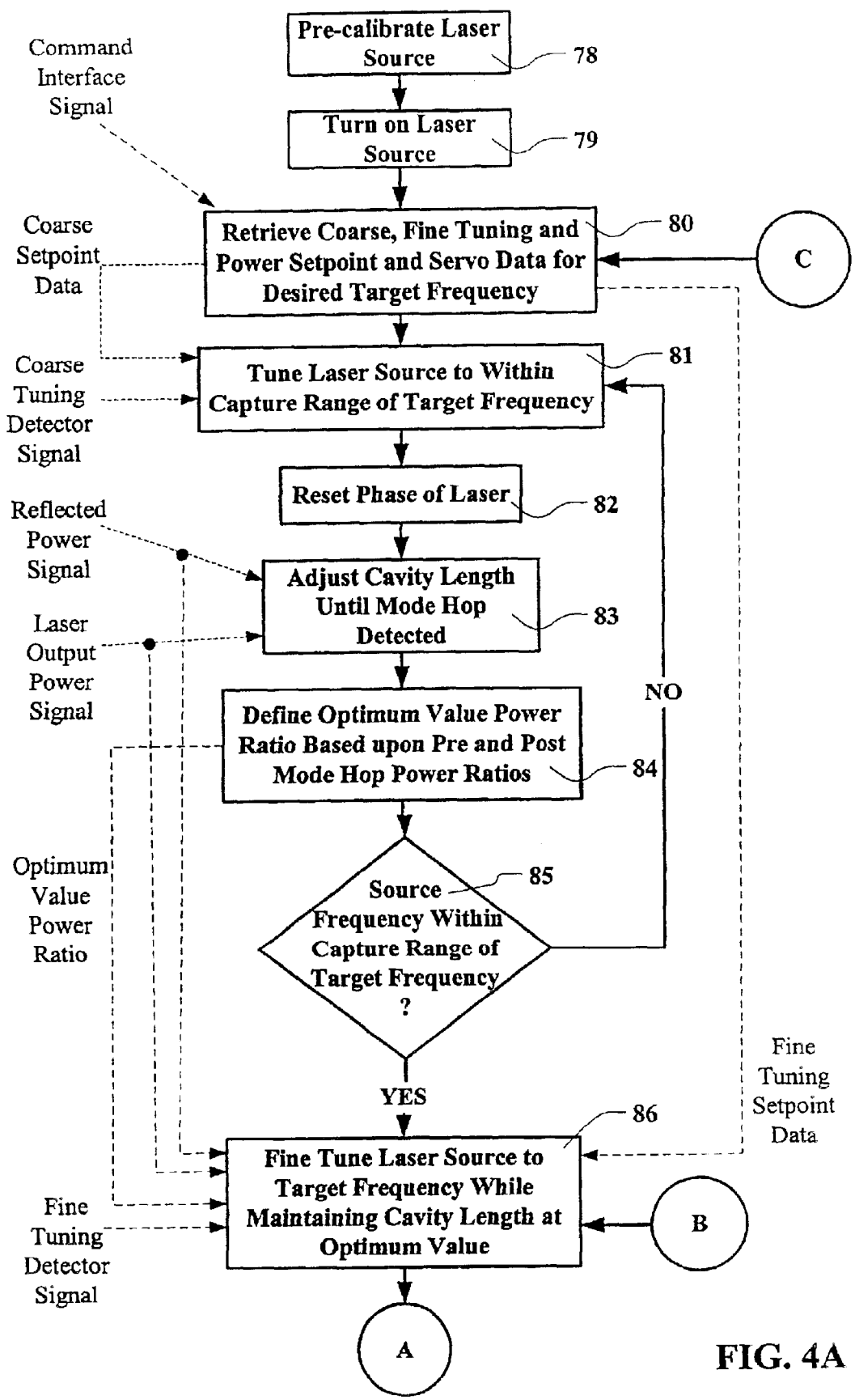
FIGS. 4A and 4B is a flow chart illustrating the operation of any of the disclosed or other embodiments of the present invention in order to stabilize the mode while tuning an output laser beam to a desired target frequency
Figure 4B:
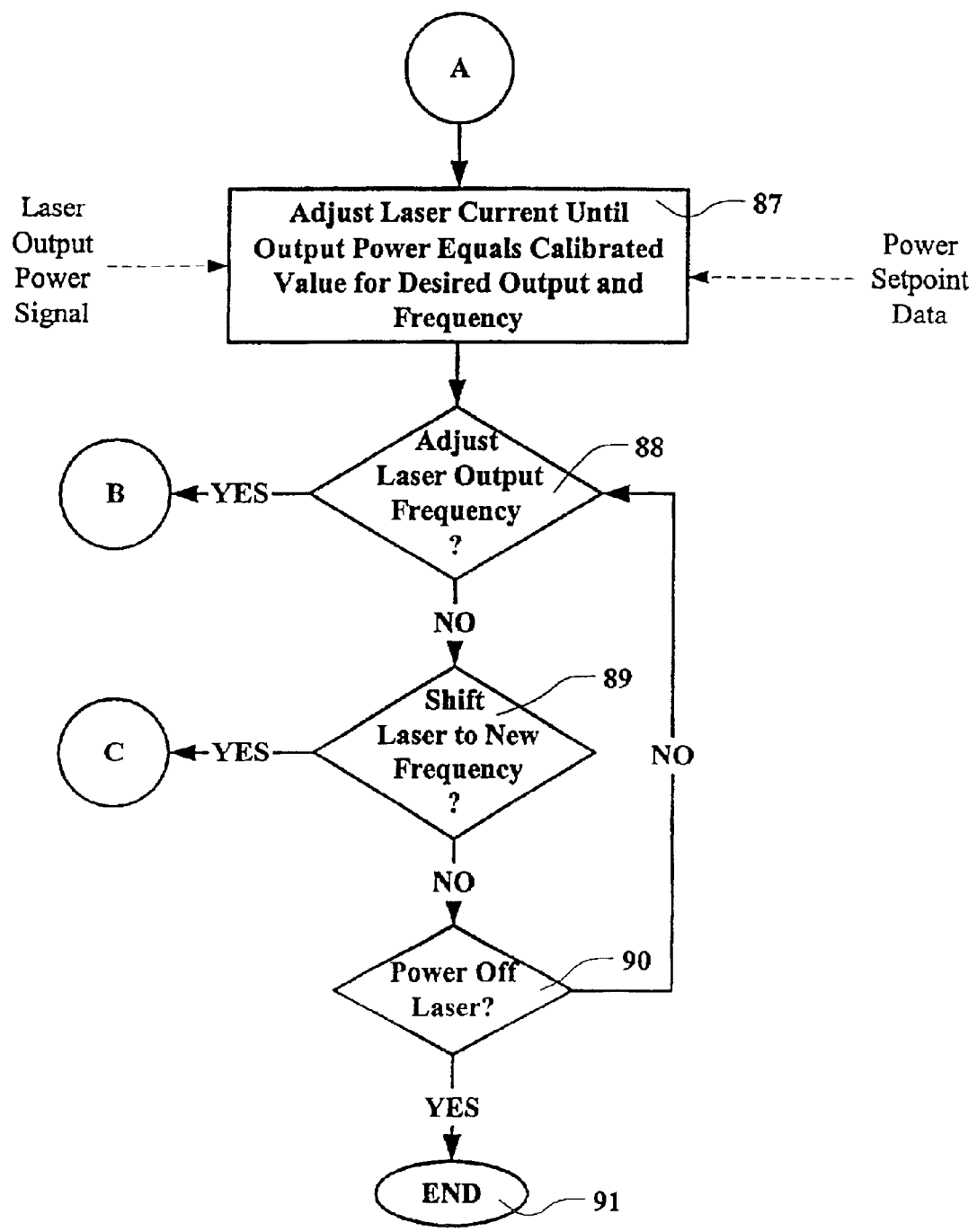

One embodiment of a method by which the various apparatus and embodiments of the present invention utilizes the above discussed spectral behavior characteristics to control the frequency and mode of the tunable laser 20 is shown in FIGS. 4A and 4B. In general, the various embodiments described herein are configured to determine the phase 128 and utilize the result of such determinations to tune the frequency without experiencing a mode hop. As shown in FIGS. 4A and 4B, this specific embodiment of the present invention is utilized to determine where the phase 128 exists and to tune the laser to a desired target frequency. More specifically, the method generally begins with pre-calibrating the laser (Operation 78). Numerous methods, systems and/or apparatus exist for calibrating lasers, for example, the method described in the Frequency Tuning Application or other methods may be described in the before mentioned references or in other references. Thus, for purposes of the present invention, any suitable calibration method, systems or apparatus may be utilized. Generally, the present invention utilizes calibrations (i.e., setpoint data) of course tuning, fine tuning, and power ratios for specific frequencies at which the laser is mode stabilized. These calibrations may be stored with the laser or elsewhere, for example, on a central control server or computer or the like.

Once any needed calibrations are accomplished, the laser source 21 is turned on (assuming it is was turned off after being calibrated)(Operation 79). As is commonly appreciated, a laser source 21 often takes a given time length to power-up and reach steady state operations. When steady state operations are obtained, the method preferably continues with a user specifying a target frequency (within the pre-set range of target frequencies supported by the given laser). The laser control unit suitably verifies the needed setpoint and servo control data is readily available and is preferably stored in an associated and readily accessible memory or storage location, such as the memory unit 73 (FIG. 3). When setpoint and other data is not readily accessible, the control unit 23, via the command interface signals 30, retrieves such information (Operation 80). It is to be appreciated that in certain applications, a given laser may be tasked with switching extremely quickly between multiple frequencies with unique setpoints. As such, Operation 80 may be repeated, as necessary, to retrieve and store those setpoints and other information necessary for operation of a given laser.

Once any setpoints or other needed data is available, the laser is coarsely tuned to a given target frequency (Operation 81). At this point, precise tuning is not necessary nor generally accomplished. Various algorithms, methods and systems for coarsely tuning a laser to a given frequency may be utilized in conjunction with the present invention. One such method, when utilized in conjunction with an apparatus such as that shown in FIG. 2A, sums the coarse tuning signal 57 and a coarse setpoint 92 (FIG. 3) to arrive at a voltage which is utilized to control the MEMS actuator 41 and the translation and/or rotation of the mirror 37. More specifically, positive and/or negative voltages may be applied to the MEMS actuator 41 until the frequency of the output beam 27, as measured by the WLL 45 and specified in the coarse tuning signal 57 equals the pre-set frequency obtained from the coarse setpoint data 92.

Once the laser is coarsely tuned to the desired target frequency, the phase of the laser is reset (Operation 82). One method for resetting the phase is to pulse of the laser source for a specified time period. In the embodiment shown in FIG. 3, such pulsing off of the laser source 21 is controlled by the laser source power pulse control circuitry 71. The laser is preferably pulsed off for 15 micro-seconds, however, shorter or greater times may be utilized. Generally, the laser source may also be pulsed off for greater than 5 micro-seconds but less than 20 micro-seconds.

After the phase of the laser is reset, the cavity length is adjusted until a mode hop is detected (Operation 83). More specifically, the length of the cavity is adjusted under the control of the PZT length control circuitry 70, by scanning the control voltage upwards, for example, along curve 120, until a mode hop 126 is detected. Additionally, while scanning the cavity length upwards, regular and periodic power ratio reading values are recorded and stored in the memory unit 73. When the cavity length/power ratio reaches point 131, for example, the mode hop 126 occurs and the power ratio jumps from the value at point 131 to the value at point 129. The optimum power ratio is obtained by averaging the value of the power ratio substantially immediately prior to the mode hop (i.e., the value at point 131) with the value of power ratio substantially immediately after the mode hop (i.e., the value at point 129) (Operation 84). This optimum power ratio value may then be stored in the memory unit 73 or otherwise as the power ratio setpoint 93.

At this point, the flow chart of FIG. 4A illustrates an optional verification may be performed that the laser source output frequency is within the capture range of the target frequency (Operation 85). This optional verification may be useful when undue delay or changes in environmental or other conditions may affect the tuning of the laser. As is commonly appreciated, many WLLs provide fine tuning capabilities assuming the laser is already within a predetermined tuning range. As such, Operation 85, provides the opportunity for an additional verification that coarse tuning has been successfully accomplished and the laser is ready for fine tuning.

In Operation 86, fine tuning of the laser source 21 is accomplished. Fine tuning is accomplished by adjusting the MEMS actuator 41 until the fine tuning signal "F" 56 equals a previously defined fine setpoint value 94 obtained from the memory unit 73. Further, while fine tuning is being accomplished, the control unit 23 suitably monitors the power ratio "R" 68 and keeps it within a predefined tolerance of the previously specified power ratio setpoint value 93. In this manner, the filter 21 can be shifted in frequency closer to the center frequency, with a negligible shift in phase. Further, changes in laser diode current 32 and path length can be compensated by introducing a slower second servo (not shown) that adjusts the cavity length in response to the difference between the power ratio signal 68 and the previously determined power ratio setpoint 93 (Operation 87). This second servo effectively, causes the power ratio to indirectly return the phase to the optimum value. Additionally, power control may be achieved by controlling the laser current 31 using the difference between the power output signal 55 and a previously determined power setpoint 95.

At this point in the method of FIGS. 4A and 4B, the output beam 27 is tuned to the desired target frequency. No mode hops should have occurred during fine tuning. The method, in FIG. 4B, continues with the control unit continuing to monitor the frequency of the output beam 27 (Operation 88). As frequency shifts/drifts occur and adjustments are necessary, the control unit suitably fine tunes the laser as previously described with respect to Operation 86.

The control unit continues to fine tune the laser 20 until either an instruction to shift to a new frequency is received (Operation 89), at which instance the control unit returns to Operation 80 and commences with coarsely tuning the laser, or an instruction to power-off the laser is received (Operation 90), at which instance the method ends. As such, the exemplary method shown in FIGS. 4A and 4B provides one method by which the frequency of a tunable laser may be controlled and/or tuned without incurring undesired mode hops.

Various other embodiments of the method of FIGS. 4A and 4B may be utilized to improve the speed and reliability of the frequency tuning and locking method. For example, if the PZT 39 has sufficient travel range, equivalent optimum phase points can be found at each wavelength of travel. The method of FIGS. 4A and 4B can then be optimized to ensure that the point closest to the center of the travel range is chosen. Similarly, the method shown in FIGS. 4A and 4B provides that a decreasing phase cavity length scan is used to determine the power ratio corresponding to the optimum power ratio. It is to be appreciated, that the same information can be obtained from an increasing phase scan if the diode is pulsed off prior to each measurement.

Further, various methods of pulsing off of the laser source can be utilized. For example, the laser source 21 might be switched off for 15 microseconds of every 10 milliseconds. When such an arrangement is utilized, the same power ratio information can be obtained with a mirror scan instead of a PZT scan, especially if the pivot point 42 has been chosen to give a relatively large number of mode hops. A laser where a mode hop occurs every 100 GHz, for example, would generally be suitably controlled by this alternative methodology. Additionally, since the value of the power ratio is independent of the laser power, current adjustment required to bring the laser to the desired power level can be made simultaneously with the phase optimization process. Alternatively, it is generally found that at constant current, the variation of the reference beam power is much smaller than that of the output beam power. In this case, many of the measurements made with the power ratio can also be made with the output power. For example, during the decreasing phase scan at constant current, the mode hops can be clearly identified in the power signal. Thus, by carrying out the ratio calculation only at the points immediately surrounding the mode hop, significant computing time can be saved.

In general, when a constant current is provided to the laser source 21, the power signal 55 is a good enough indicator of the frequency of the output beam and the occurrence of mode hops, that the beforementioned phase centering and fine locking operations can be accomplished without utilizing the first reference signal 28. The first reference signal 28 and the corresponding ratio signal 68 become important to finely tuning and controlling modes when the cavity length varies because the current is changed in order to control the output power of the laser source 21.

Additionally, other types of actuators may require other control algorithms that differ in detail from those described herein. For example, if an angle actuator, such as a PZT, has no component of cavity length change, then the angle actuator cannot be controlled by the fine locker signal because the frequency only changes in jumps at mode hops. An algorithm where the fine servo controls the cavity length while the power ratio controls the angle actuator would be an alternative embodiment.

Figure 7:
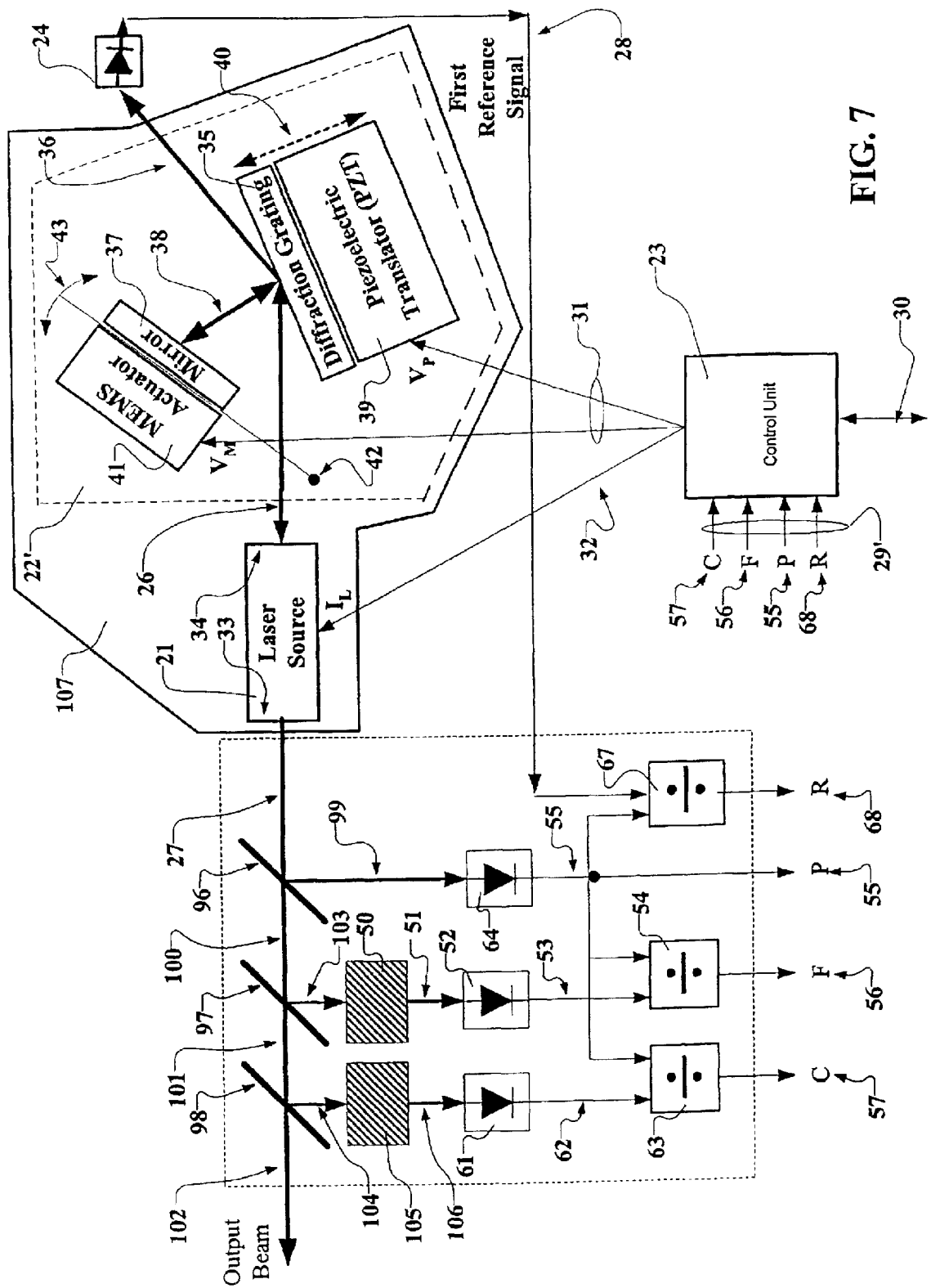
FIG. 7 is a block diagram of a third embodiment of a tunable laser of the present invention in which another embodiment of a second optical detector, in combination with a first optical detector, is utilized to stabilize the mode while tuning an output laser beam to a desired target frequency.

With reference now to FIG. 7, an alternative embodiment of the second optical decoder is shown. In this embodiment, the laser source 21, filter 22, control unit 23, first optical detector 24 and the WLL 45 are substantially the same as those components previously discussed with reference to FIG. 2A. As shown in FIG. 7, however, three optical power dividers 96, 97 and 98 are utilized to divide output beam 27 and measure the various tuning and power aspects of the output beam. More specifically, a power optical divider 96 is utilized to provide a minor portion of the output beam 27 to the power signal optical detector 64. In this embodiment, the power signal optical detector 64 receives a power beam 99 which is representative of the total power of the output beam 27. As such, no summing circuits are utilized to provide the power output signal to the control unit 23 and/or to the various divisor circuits 54, 63, and 67 (when such mathematical functions and operations are not implemented in a calculation unit or the control unit 23).

Upon passing through the power optical divider 96, a residual 100 of the output beam 27 is passed through a fine optical detector 97. This detector 97 provides another minor portion of the output beam 27 to the fine tuning reference element 50. At this point the beam 103 is processed by the fine tuning reference element 50, the fine tuning optical detector 52 and the fine tuning divisor circuit 54 as is set forth previously hereinabove with reference to FIG. 2A.

Further, the residual 101 of the output beam 27 is also passed through a coarse optical detector 98. This detector 98 provides another minor portion of the output beam 27 to a coarse tuning element 105. The coarse tuning element 105 provides an output beam 106 to the coarse optical detector 61 and then to the coarse tuning divisor circuit 63. Essentially, this embodiment provides similar outputs to the embodiment shown in FIG. 2A. However, instead of using a single power divider to split the output beam 27, this embodiment provides for a direct reading of the power of the output beam 27 by separately splitting off the power beam 99 and providing such power beam 99 directly to the power signal optical detector 64.

Therefore, it is to be appreciated that other embodiments of wavelength lockers, optical detectors and similar components may be utilized in conjunction with the present invention to measure and provide signal characteristics of an outputted laser beam to a control unit for a laser. Similarly, various other embodiments of ECLs, tunable lasers and other components, devices, methodologies, operations and systems may be utilized in conjunction with the present invention. As such, the present invention is not to be construed as being limited in scope to the embodiments specifically discussed herein. Similarly, the present invention is not to be construed as being limited in application to only communication systems. The apparatus, methods and/or teachings of the present invention may be used in other applications such as remote sensing, inter-satellite communications, short range terrestrial links and otherwise.

As can be seen from the foregoing, various apparatus and methods for tuning the frequency of a laser while stabilizing the mode of the frequency has been provided. The present invention has eliminated the need for encoders, spectrometers and other devices in order to tune an output beam to a desired target frequency while stabilizing the mode of the output beam.

What is claimed is:

1. A tunable laser apparatus operable at a plurality of modes over an optical frequency range comprising a laser source for generating first and second beams of light, a first optical detector for receiving at least a portion of the first beam of light and generating a first signal, a second optical detector for receiving at least a portion of the second beam of light and generating a plurality of second signals that include at least one of a coarse tune signal and a fine tune signal and at least one of a power signal and a ratio signal, and a control unit coupled to the first and second optical detectors for generating a plurality of control signals to control a frequency and mode of the second beam of light.

2. A tunable laser apparatus operable at a plurality of modes over an optical frequency range comprising a laser source for generating first and second beams of light, a first optical detector for receiving at least a portion of the first beam of light and generating a first signal, a second optical detector for receiving at least a portion of the second beam of light and generating a second signal, a control unit coupled to the first and second optical detectors for generating at least one control signal, and a filter for receiving the at least one control signal to stabilize the apparatus on the mode.

3. The apparatus of claim 2 wherein the first optical detector measures the power of at least a portion of the first beam of light and provides a representation of the measured power in the first signal.

4. The apparatus of claim 2 wherein the laser source has a first facet, further comprising an optical power divider disposed between the first facet of the laser source and the filter for directing a portion of the first beam of light to the first optical detector, wherein the first optical detector is an optical power detector for measuring the power of the portion of the first beam of light and providing a representation of the measured power in the first signal.

5. A tunable laser apparatus operable at a plurality of modes over an optical frequency range comprising a laser source for generating first and second beams of light, a first optical detector for receiving at least a portion of the first beam of light and generating a first signal, a second optical detector for receiving at least a portion of the second beam of light and generating a second signal, a control unit coupled to the first and second optical detectors for generating at least one control signal to stabilize the apparatus on a mode and an optical power divider for dividing the second beam of light into first and second portions, the second optical detector being part of a wavelength locker.

6. The apparatus of claim 5, wherein the second optical detector measures the power of first portion of the second beam of light and provides a representation of the measured power in the second signal.

7. The apparatus of claim 6, wherein the wavelength locker further comprises a ratio divisor circuit configured to receive the first and second signals, wherein the ratio divisor circuit calculates the ratio of the second signal to the first signal.

8. The apparatus of claim 5, wherein the wavelength locker, based upon the first portion, outputs at least one of a coarse tuning signal, a fine tuning signal, and a power output signal, wherein the power output signal provides a measurement of the power provided by the second beam of light.

9. The apparatus of claim 8, wherein the control unit further comprises a digital signal processor, which receives at least one of the coarse tuning signal, the fine tuning signal, the power output signal, and a ratio signal, and based upon a comparison against a corresponding coarse setpoint, fine setpoint, power output setpoint and a power ratio setpoint the digital signal processor tunes the frequency and controls the mode of the second beam of light.

10. The apparatus of claim 1, wherein the control unit further comprises a laser source power pulse control circuit that resets the phase of the laser source by pulsing the laser source power off for between five and twenty microseconds.

11. The apparatus of claim 10, wherein the pulse control circuit pulses the laser source power off for fifteen microseconds.

12. A tunable laser apparatus operable at a plurality of modes over an optical frequency range comprising a laser source for generating first and second beams of light, a diffractive element positioned relative to the laser source to receive and diffract the first beam, a reflective element positioned relative to the diffractive element so as to receive a portion of the first beam of light diffracted by the diffractive element, reflect the received portion back towards the diffractive element and thereafter to the laser source so as to cause a diffracted and reflected portion of the first beam to lase at a given frequency and exit the laser source as the second beam of light via a front facet, a first actuator coupled to the diffractive element, a second actuator coupled to the reflective element, the first and second actuators being capable of changing the relative position of the diffractive element and the reflective element, a first optical detector for receiving at least a portion of the first beam of light and generating a first signal, a second optical detector for receiving at least a portion of the second beam of light and generating a second signal and a control unit coupled to the first and second optical detectors for generating at least one control signal to stabilize the apparatus on a mode.

13. The apparatus of claim 12, wherein changing the relative position of the diffractive element and the reflective element serves to change at least one of the mode and the frequency of the second beam of light.

14. The apparatus of claim 13, wherein the first actuator is a piezoelectric translator and the second actuator is a MEMS actuator.

15. The apparatus of claim 14, wherein the control unit further comprises:
a digital signal processor; and
a PZT length control circuit;
wherein the digital signal processor detects a mode hop for a target frequency based upon a noticeable change in the value of the ratio of the first signal to the second signal while the PZT length control circuit directs the first actuator to change the length of the external cavity filter and scan across the operating frequency of the laser sources, while the second actuator holds the frequency of the output laser beam at approximately the target frequency.

16. The apparatus of claim 15, wherein the digital signal processor fine tunes the second beam of light to the target frequency while preventing additional mode hops from occurring by holding the ratio equal to a power ratio setpoint while fine tuning the second beam of light to the target frequency.

17. The apparatus of claim 1, wherein the laser source further comprises a laser diode.

18. A method for tuning a laser apparatus operable at a plurality of modes over an optical frequency range and having a laser source providing first and second beams of light, comprising the steps of monitoring the power of the first and second beams of light before and after a mode hop and utilizing the monitored power to stabilize the apparatus on a mode.

19. The method of claim 18, wherein the monitoring step includes obtaining values of a power ratio of the first and second beams of light before and after the mode hop and computing an optimum power ratio by averaging values of the power ratio substantially immediately prior to the mode hop and substantially immediately after the mode hop.

20. A method for tuning a laser apparatus operable at a plurality of modes over an optical frequency range and having a laser source providing first and second beams of light, comprising the steps of coarsely tuning the laser to a target frequency, monitoring the power of the first and second beams of light and utilizing the monitored power to stabilize the apparatus on a mode, the coarsely tuning step including the steps of obtaining a coarse tuning setpoint value; receiving a coarse tuning signal, that provides an indication of the current frequency of an output laser beam emitted by the laser, comparing the coarse tuning signal to the coarse tuning setpoint value and providing control signals to the laser based upon a result of the comparison so as to coarsely tune the laser to the target frequency.

21. The method of claim 20, further comprising resetting the phase of the laser.

22. The method of claim 21, wherein the phase of the laser is reset by pulsing the laser off.

23. The method of claim 21, wherein the phase of the laser is reset after the laser is coarsely tuned.

24. The method of claim 19, further comprising adjusting the length of a filter connected to the laser until a mode hop occurs.

25. The method of claim 18, wherein an average power ratio value is stored as a power ratio setpoint in a memory unit accessible by a control unit utilized to tune the laser.

26. The method of claim 25, further comprising:
while finely tuning the laser, obtaining a current value of the ratio;
recalling the power ratio setpoint value from the memory unit;
comparing the current value of the ratio to the power ratio setpoint value; and
adjusting a length of a filter attached to the laser such that the current value of the ratio is equal to the power ratio setpoint value.

27. The method of claim 25, wherein the memory unit contains a plurality of average power ratio settings for each of a plurality of target frequencies which may be generated by the laser.

28. A tunable laser comprising a laser source for providing light with a wavelength along an optical path, a diffractive element positioned in the optical path and spaced from the laser source for redirecting the light received from the laser source, a reflective element positioned in the optical path and spaced from the diffractive element for receiving the light redirected by the diffracted element and for further redirecting the light along the optical path to the diffractive element, the diffractive element receiving the light further redirected by the reflective element and returning the light along the optical path to the laser source the optical path created by the laser source, the diffractive element and the reflective element causing the light to lase at the wavelength, a first microactuator coupled to the reflective element and a second microactuator coupled to the diffractive element for moving such elements to select the wavelength of light a control unit for controlling the mode and frequency of the wavelength of light as the laser is tuned to a target frequency, at least one of the first microactuator and the second microactuator receiving a control signal from the control unit which causes at least one of the first and second microactuators to change the position of the diffractive element and the reflective element so that a mode hop does not occur as the laser is approximately held to a target frequency.

29. The tunable laser of claim 28, wherein the second microactuator is a microelectromechanical actuator.

30. The tunable laser of claim 29, wherein the second microactuator is a piezoelectric microactuator.

31. The tunable laser of claim 28, wherein the first microactuator is a microelectromechanical actuator.

32. The tunable laser of claim 31, wherein the first microactuator is an electrostatic microactuator.

33. The tunable laser of claim 28, wherein one of the first microactuator and the second microactuator is utilized to control the mode of the wavelength of the light while the other one of the first microactuator and the second microactuator is utilized to tune the wavelength of light to a target frequency.

34. The tunable laser of claim 28, further comprising a wavelength locker for receiving light from the laser source along a second optical path and generating a plurality of signals based on the received light, the control unit processing the plurality of signals to produce the control signal.

35. The method of claim 28 wherein the utilizing step includes the step of calculating a ratio of the power of the second beam of light relative to the power of the first beam of light.

36. The method of claim 19 wherein the utilizing step includes the step of calculating an average of the ratio before a mode hop and the ratio after a mode hop.

37. A tunable laser having an optical cavity and operable at one of a plurality of optical modes comprising means for selecting one of the plurality of optical modes, means for varying an optical phase of said optical mode in the optical cavity of said tunable laser, means for measuring optical power existent in said laser, means for generating at least one of a fine tune signal and a coarse tune signal and at least one of a power signal and a ratio signal responsive to said means for measuring, and means for controlling said means for selecting and said means for varying responsive to said means for generating.

* * * * *